United States Patent [19]

Satoh et al.

[11] Patent Number: 5,402,563

[45] Date of Patent: Apr. 4, 1995

[54] APPARATUS FOR REMOVING ELECTRONIC DEVICE FROM PRINTED CIRCUIT BOARD

[75] Inventors: Takanori Satoh; Satoru Ezaki; Tatsumi Shibata, all of Hadano, Japan

[73] Assignee: Hitachi, Ltd., Japan

[21] Appl. No.: 105,111

[22] Filed: Aug. 12, 1993

[30] Foreign Application Priority Data

Aug. 28, 1992 [JP] Japan .................................. 4-229691

[51] Int. Cl.[6] ........................ H05K 3/00; B23P 19/00
[52] U.S. Cl. ...................................... 29/829; 29/741; 228/264
[58] Field of Search ................. 29/426.5, 839, 741; 228/20, 264, 180.1, 180.2

[56] References Cited

U.S. PATENT DOCUMENTS

| | | | |
|---|---|---|---|
| 3,834,605 | 9/1974 | Coffin | 29/426.5 X |
| 3,879,836 | 4/1975 | Coffin | 29/839 X |
| 4,610,388 | 9/1986 | Koltuniak et al. | |
| 4,637,542 | 1/1987 | Breske et al. | 228/264 X |
| 4,805,827 | 2/1989 | Coffman et al. | |

FOREIGN PATENT DOCUMENTS

| | | | |
|---|---|---|---|
| 3040274 | 6/1983 | Germany. | |
| 3624728 | 4/1987 | Germany. | |
| 55-68177 | 5/1980 | Japan. | |
| 57-91874 | 6/1982 | Japan. | |
| 1-243497 | 9/1989 | Japan | 29/839 |
| 4-61191 | 2/1992 | Japan | 29/839 |
| 2234461 | 2/1991 | United Kingdom | 228/264 |

OTHER PUBLICATIONS

IBM Tech. Discl Bull vol. 20 No. 8 Jan. 1978 pp. 3028-3029 by P. L. Baron et al.

Primary Examiner—Carl J. Arbes
Attorney, Agent, or Firm—Evenson, McKeown, Edwards & Lenahan

[57] ABSTRACT

An apparatus for removing an electronic device from a printed circuit board includes a board support for supporting the printed circuit board with the first main surface thereof directed upwardly and for vertically moving the printed circuit board; a lower heating device for applying heat from the second main surface side of the printed circuit board; an upper heating device for applying heat from the first main surface side of the printed circuit board; a withdrawal device disposed on the first main surface side of the printed circuit board for applying a force to withdraw the electronic device from the printed circuit board, the withdrawal device detecting the withdrawal of the electronic device; and a solder elimination device disposed on the first main surface side of the printed circuit board, the solder elimination device comprising a hood for covering that portion of the printed circuit board where the electronic device is mounted, and a pressure control device for increasing or decreasing a pressure within an internal space of the hood to drive the solder out of the through holes by pressurization or suction.

10 Claims, 6 Drawing Sheets

F I G. 2
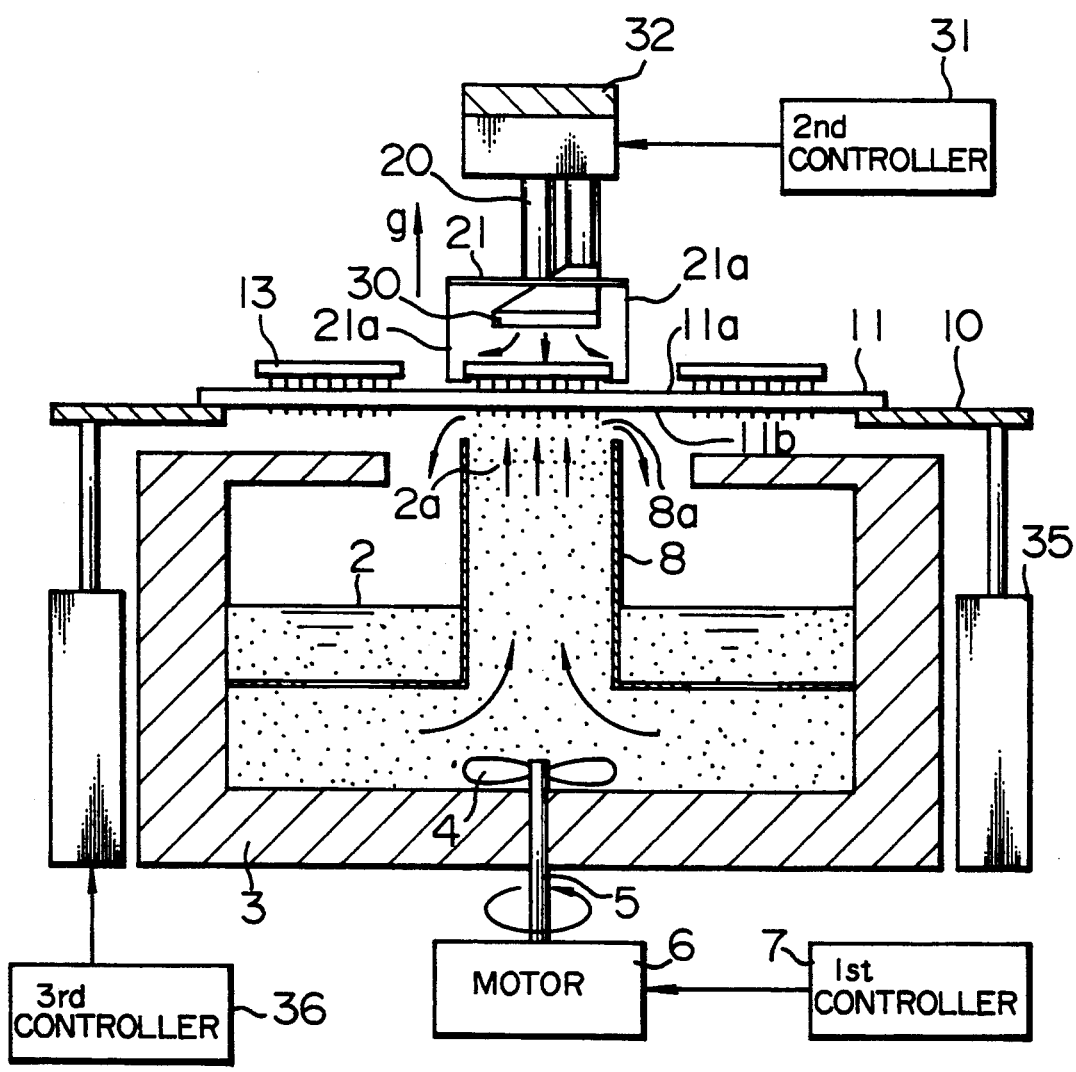

APPARATUS FOR REMOVING ELECTRONIC DEVICE FROM PRINTED CIRCUIT BOARD

BACKGROUND OF THE INVENTION

This invention relates to an apparatus for removing electronic devices or components (e.g. semiconductor devices), mounted by being soldered on a printed circuit board.

Conventional apparatuses of the type described are disclosed, for example, in Japanese Patent Unexamined Publication Nos. 55-68177 and 57-91874.

More specifically, the former publication discloses an apparatus in which when an electronic device is to be removed from a printed circuit board, the operator removes solder from each lead pin of the individual electronic devices by means of a vacuum suction nozzle tip.

The latter publication discloses an apparatus in which whole of soldered portions of an electronic device is heated by a jet of melted solder in a solder bath, to melt the solder on all the soldered portions, thereby removing the electronic device from a printed circuit board.

In the former apparatus, the operator manually melts the solder on each lead pin, and then removes each electronic device. This operation is repeated, and therefore is cumbersome. Therefore, this method is not suitable for removing a large number of electronic devices.

In the latter apparatus, when the solder on the electronic devices mounted on the printed circuit board is to be melted, heating is applied only to the lead pin side of the printed circuit board, which results in a problem that much time is required for melting the solder. Furthermore, when the electronic device is withdrawn with the solder not yet fully melted, electrode walls or surfaces of through holes in the printed circuit board are damaged. To prevent this, when a heat capacity needed for melting the solder on the electronic devices is not clearly known, a heating time is made to be sufficiently long. Therefore, the removal of the electronic devices is inefficient, and besides the printed circuit board itself may be damaged by such long-time heating.

SUMMARY OF THE INVENTION

It is therefore an object of the invention to provide an apparatus for and a method of efficiently removing electronic devices from a printed circuit board without damaging the printed circuit board even when a heat capacity needed for melting solder of the electronic devices is not clearly known.

According to one aspect of the present invention, there is provided apparatus for removing an electronic device from a printed circuit board wherein lead pins of the electronic device are inserted respectively into through holes in the printed circuit board and are fixedly mounted on the printed circuit board by being soldered, and the printed circuit board has a first main surface in facing relation to which a body of the electronic device is disposed, and a second main surface from which distal end portions of the lead pins are projected, the apparatus comprising:

board support means for supporting the printed circuit board with the first main surface thereof directed upwardly and for vertically moving the printed circuit board;

lower heating means for applying heat to soldered portions from the second main surface side of the printed circuit board;

upper heating means for applying heat to the soldered portions from the first main surface side of the printed circuit board;

withdrawal means disposed on the first main surface side of the printed circuit board for applying a force to withdraw the electronic device from the printed circuit board, the withdrawal means detecting the withdrawal of the electronic device; and solder elimination means disposed on the first main surface side of the printed circuit board, the solder elimination means comprising a hood for covering that portion of the printed circuit board where the electronic device is mounted, and a pressure control device for increasing or decreasing a pressure within an internal space of the hood to drive the solder out of the through holes by pressurization or suction.

The lower heating means comprises a fluid vessel holding a heated fluid, a nozzle, and a propeller for ejecting the heated fluid from the fluid vessel to the second main surface of the printed circuit board via the nozzle.

The upper heating means comprises a hot blast nozzle for applying a blast of hot gas to an upper surface of the body of the electronic device.

The upper heating means may comprise a heat block for coming into contact with an upper surface of the body of the electronic device to heat the body through heat transfer.

Preferably, the solder elimination means further comprises heater means for keeping the interior of the hood to a high temperature.

Preferably, the lower heating means further comprises a shield device for shielding the second main surface of the printed circuit board from the heated fluid.

According to another aspect of the invention, there is provided a method of removing an electronic device from a printed circuit board wherein lead pins of the electronic device are inserted respectively into through holes in the printed circuit board and are fixedly mounted on the printed circuit board by being soldered, and the printed circuit board has a first main surface in facing relation to which a body of the electronic device is disposed, and a second main surface from which distal end portions of the lead pins are projected, the method comprising the steps of:

applying heat to soldered portions from the first and second main surface sides of the printed circuit board at the same time to melt the solder, while applying a withdrawing force to the electronic device, and removing the electronic device from the printed circuit board; and subsequently driving the solder out of the through holes by pressurization or suction, thus eliminating the solder from the through holes.

Preferably, the elimination of the solder by pressurization or suction is effected while the through holes are in a heated condition.

In the present invention, since heat is applied from the first and second main surface sides of the printed circuit board at the same time, the solder can be melted in a short time. Furthermore, since the heating is effected while applying the withdrawing force to the electronic device, the electronic device is withdrawn from the printed circuit board immediately when the solder becomes molten. This avoids unnecessary heating, and therefore is efficient.

DESCRIPTION OF THE DRAWINGS

FIGS. 2 and 3 are schematic cross-sectional views of the apparatus;

DESCRIPTION OF THE PREFERRED EMBODIMENTS

Figure 1:
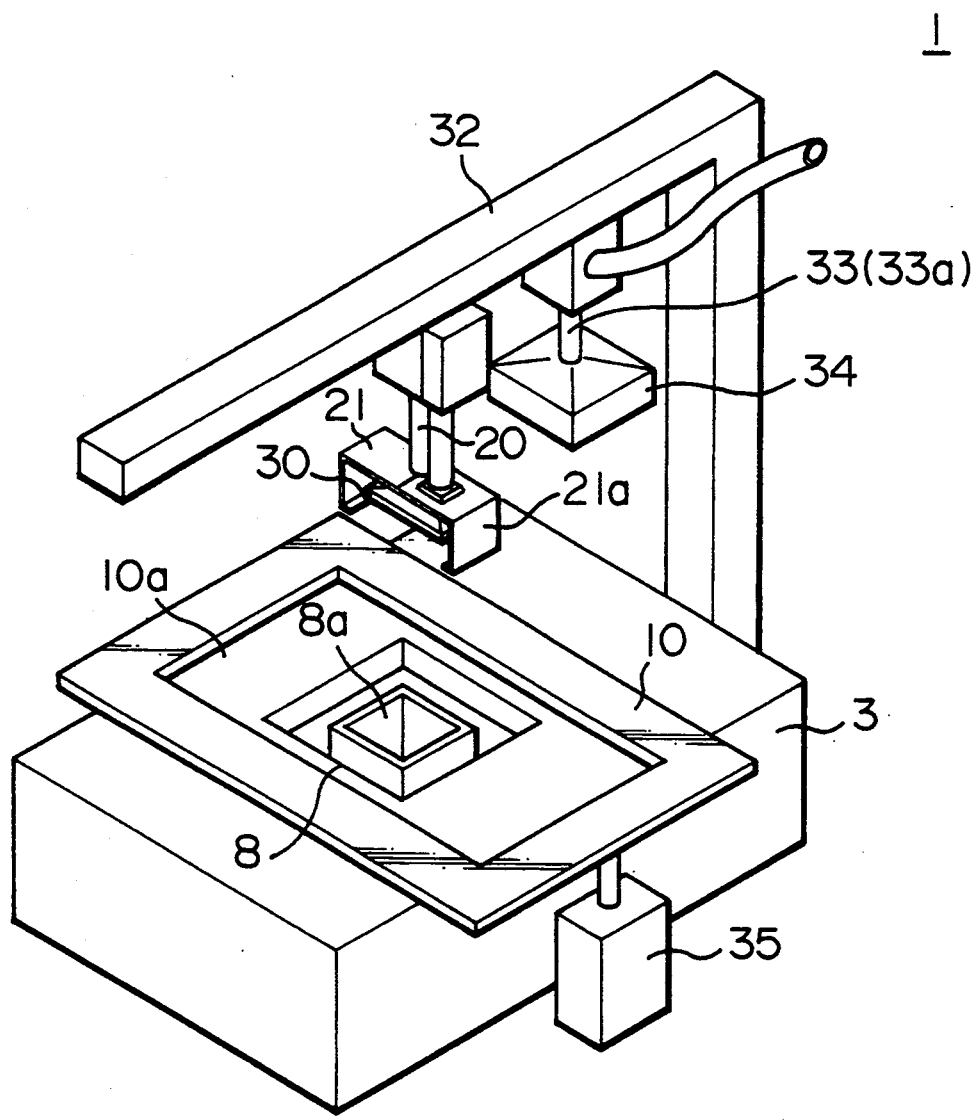
FIG. 1 is a perspective view of an apparatus for removing electronic devices from a printed circuit board, provided in accordance with the present invention.
Figure 3:
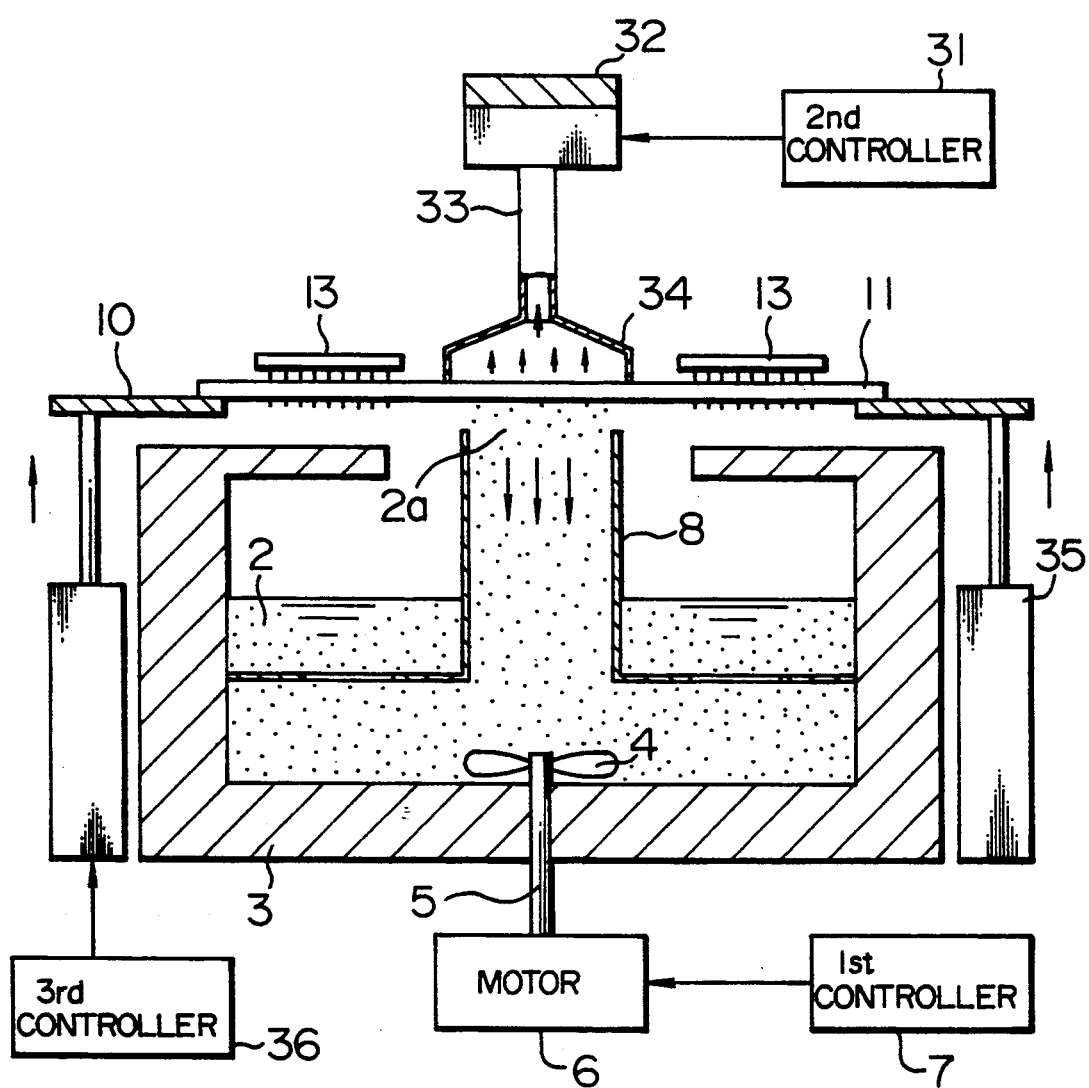

An apparatus for removing electronic devices from a printed circuit board according to the present invention will now be described in detail with reference to the drawings.

The apparatus 1 for removing electronic devices from a printed circuit board includes a solder vessel or bath 3 holding molten solder 2. A propeller 4 for driving the molten solder 2 upward is mounted adjacent to an inner bottom surface of the solder vessel 3. The propeller 4 is connected to a motor 6 provided outside through a propeller shaft 5, and the activation and stop of the motor 6, as well as the rotational speed of the motor 6, are controlled by a first controller 7.

A jet nozzle 8 is provided generally at a central portion of the solder vessel 3, and has an upwardly-directed open end or ejection port 8a. The molten solder 2 driven upward by the propeller 4 is ejected from the ejection port 8a of the jet nozzle 8 to form a jet 2a of molten solder. The level (i.e., height of ejection) of the jet 2a from the ejection port 8a is determined by the rotational speed of the propeller 4. In this embodiment, the height of ejection of the jet 2a can be adjusted by controlling the number of revolution of the motor 6 (which drives the propeller 4) through the first controller 7.

Mounted above the solder vessel 3 is a stage 10 which has a central opening 10a through which the ejection port 8a of the jet nozzle 8 is exposed upwardly. A printed circuit board 11 is adapted to be placed on the upper surface of the stage 10. The stage 10 is supported by lifters 35 which are extensible and contractible vertically (i.e., upward and downward), and therefore the stage 10 can be moved and positioned by the lifters 35 to a desired height. The operation of the lifters 35 is controlled by a third controller 36.

Figure 4:
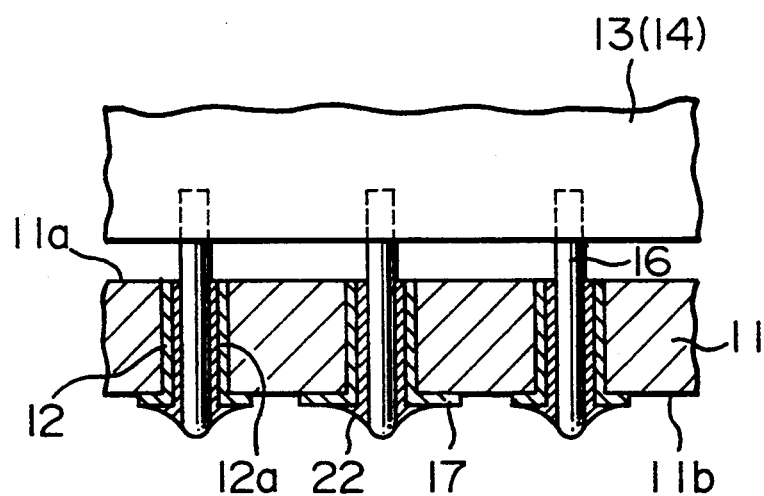
FIG. 4 is a fragmentary, cross-sectional view showing the structure of the printed circuit board.

The printed circuit board 11 is, for example, a multilayer printed circuit board which is formed by applying a copper foil onto one side or face of each of several glass epoxy resin plates, then etching each copper foil into a respective one of predetermined patterns to form wiring, and then laminating these resin plates. Semiconductor devices 13 are mounted on an obverse surface (upper surface in FIG. 11) 11a of the printed circuit board 11. The semiconductor device 13 has a plurality of lead pins 16 extending from a side surface of a package body 14 and bent downwardly. As shown in FIG. 4, the lead pins 16 are inserted through respective through holes 12 (which are formed in the printed circuit board 11) with a predetermined frictional force. The distal end portion of each pin 16 passed through the through hole 12 is projected slightly from a reverse surface 11b of the board 11, and is connected by solder 22 to a wiring pattern 17, formed on the reverse surface 11b, and also to a conductive layer 12a formed on an inner peripheral surface of the through hole 12.

Provided above the stage 10 supporting the printed circuit board 11 is a chuck 21 which is suspended from a slide stage 32 through a vertically-movable rod 20. A pair of holder pawls 21a of a generally L-shape are provided at the distal end portion of the chuck 21, and are adapted to move toward and away from each other so as to hold the package body 14 of the semiconductor device 13 therebetween from the opposite sides of this package body.

A hot blast nozzle 30 is provided between the pair of holder pawls 21a of the chuck 21, this nozzle 30 having a discharge port directed toward an upper surface of the package body 14 held between the pair of holder pawls 21a. The temperature and flow rate of the hot air blown from the nozzle 30 to the upper surface of the package body 14 are controlled by a second controller 31.

Figure 5:
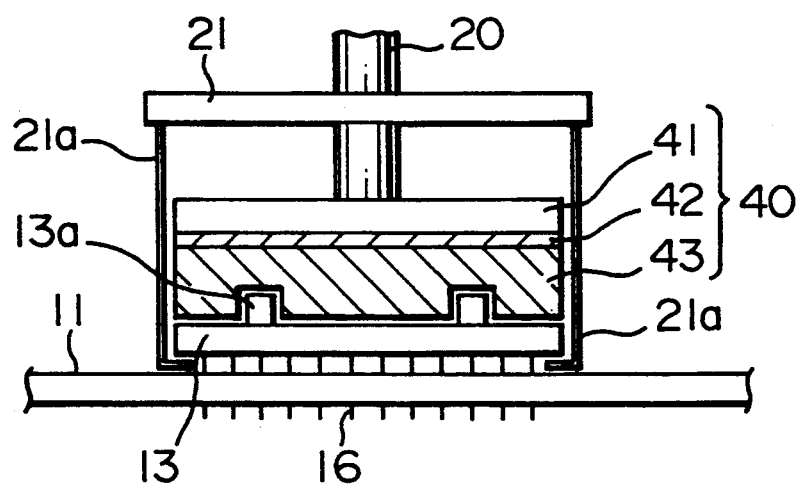
FIG. 5 is a schematic cross-sectional view showing a modified upper heating device.

Means for heating the semiconductor device 13 from its upper side is not limited to the hot blast nozzle 30, and may comprise, for example, a heat block 40 shown in FIG. 5, which is provided between the pair of holder pawls 21a of the chuck 21, and includes a heater base 41, a rubber-like heater 42 and a copper block 43. This heater block 40 is brought into contact with the upper surface of the semiconductor device 13 to heat the same to a desired temperature.

The rod 20 of the chuck 21 is supported on the slide stage 32 for horizontal movement therealong, and can position the chuck 21 in a desired position by a moving mechanism (not shown).

A suction pipe 33 is mounted on the slide stage 32, and is horizontally movable in coordinate relation to the rod 20 of the chuck 21. The suction pipe 33 can also be moved vertically (i.e., upward and downward) by a drive means (not shown). A caplike hood 34 is fixedly secured to the distal end of the suction pipe 33. The interior of the hood 34 is connected to a negative pressure (vacuum) source (not shown), such as a vacuum pump, via the suction pipe 33 so as to be maintained at a predetermined negative pressure.

The operation of this embodiment will now be described.

First, the printed circuit board 11 is placed on the stage 10 in such a manner that its obverse surface 11a having the semiconductor devices 13 mounted thereon is directed upward, and the printed circuit board 11 is positioned in such a manner that a target semiconductor device 13 (i.e., a semiconductor device to be removed) is located just above the jet nozzle 8. Then, the chuck 21 moves downward toward the obverse surface 11a of the printed circuit board 11, and the package body 14 of the semiconductor device 13 is clamped between the pair of holder pawls 21a of the chuck 21, and a lifting force g acting upward (FIG. 2) is applied to this package body 14.

Then, the motor 6 provided below the solder vessel 3 is operated to rotate the propeller 4, provided within the solder vessel 3, at a predetermined speed. As a result of the rotation of the propeller 4, a jet is formed in the molten (heated) solder 2 held in the solder vessel 3, so that the molten solder 2 is continuously ejected upward in a jet 2a from the ejection port 8a.

The height of the solder jet 2a at this time is maintained at a constant level by controlling the rotational speed of the propeller 4, so that the solder jet 2a is kept in contact with the reverse surface 11b of the printed circuit board 11. The solder 22 in the through holes 12 of the printed circuit board 11, as well as the solder 22 fixing the lead pins 16, becomes completely molten by the heat of the solder jet 2a brought into contact with the printed circuit board 11. Simultaneously with the formation of the solder jet 2a by activating the motor 6, a blast of hot air is applied to the upper surface of the package body 14 from the hot blast nozzle 30, disposed between the pair of holder pawls 21a of the chuck 20, to heat the package body 14 to prevent the heat, applied to the reverse surface 11b of the printed circuit board 11 by the solder jet 2a, from dissipating from the upper surface of the package body 14 disposed on the obverse surface side of the printed circuit board 11, thereby shortening the time required for melting the solder 22 in the through holes 12 and the solder fixing the lead pins 16.

At this time, the chuck 21 urges, by the lifting force g, the semiconductor device 13 in a direction to withdraw the lead pins 16. Therefore, when the solder 22 becomes molten, the semiconductor device 13 is withdrawn from the printed circuit board 11. At this time, the lifting force g acts in a direction perpendicular to the printed circuit board 11, that is, in the direction of the axes of the through holes 12 extending through the printed circuit board 11 perpendicularly from the obverse surface 11a to the reverse surface 11b, and therefore the printed circuit board 11 is smoothly withdrawn upwardly without damaging the lead pins 16 passed through the respective through holes 12, the conductive layers 12a formed on the inner peripheral surfaces of the respective through holes 12, and the wiring patterns 17.

When the chuck 21 is lifted a predetermined amount, a limit switch (not shown) detects the removal of the electronic device 13 by being turned-on. Then, the hood 34 moves horizontally along the slide stage 32, and is positioned just above that portion of the printed circuit board 11 from which the semiconductor device 13 has been removed. Further, the hood 34 is moved downward to such a level that the peripheral edge of the hood 34 is held in contact with the printed circuit board 11, and the hood 34 is held stationary in this position.

Figure 6:
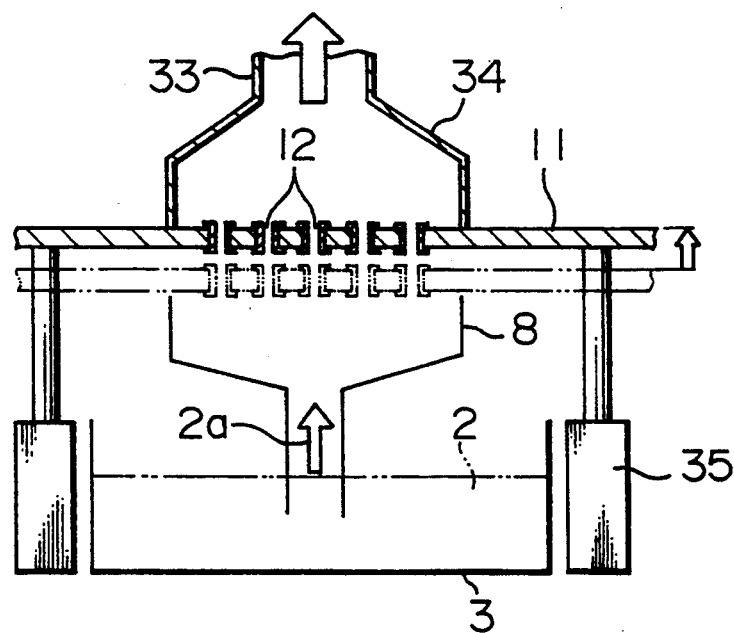
FIG. 6 is a schematic view showing the operation of the apparatus of the invention.

The lifters 35 move the stage 10 with the hood 34 upward to bring the printed circuit board 11 away from the jet nozzle 8 (FIG. 6). At the same time, the motor 6 forming the solder jet 2a at the distal end of the jet nozzle 8 is stopped.

The vacuum pump (not shown) is operated to maintain a closed space (which is defined by the hood 34 and that portion of the printed circuit board 11 from which the semiconductor device 13 has been removed) at a negative pressure via the suction pipe 33.

As a results of these sequential operations, the molten solder 22 and the molten solder 2 residing in the through holes 12 are withdrawn by the vacuum pump. Therefore, the resolidification and remaining of the solder 22 in the through holes 12 are prevented positively and efficiently. Therefore, after the semiconductor device 13 is withdrawn, any solidified solder 22 will not close the through holes 12, and will not remain as a foreign matter in the through holes 12. At this time, by keeping the above-mentioned closed space to an atmosphere of an inert gas such as nitrogen gas, the solidification of the solder is retarded, so that the removal of the molten solder by suction can be positively effected. As a result, any burr is prevented from being formed at a boundary between the obverse surface 11a of the printed circuit board 11 and the through holes 12.

As described above, the heating is applied by the solder jet 2a to the reverse side 11b of the printed circuit board 11, and also the heating is applied by the hot blast nozzle 30 to the upper surface of the semiconductor device 13 on the obverse side 11a of the printed circuit board 11, so that the solder 22 in the through holes 12 becomes molten in a very short time. Therefore, the time of direct contact of the high-temperature molten solder 2 (solder jet 2a) with the printed circuit board 11 is shortened, so that the whole of the printed circuit board 11 is prevented from being overheated. Therefore, damage to the printed circuit board 11 resulting from such overheating is efficiently prevented.

When the heating is effected by the solder jet 2a and the hot blast nozzle 30, the semiconductor device 13 is withdrawn upwardly in a direction perpendicular to the printed circuit board 11 by the chuck 21 imparting the lifting force g of a predetermined magnitude to the semiconductor device 13. Therefore, damage to the through holes 12 and other parts of the printed circuit board 11 due to an undue unbalanced load is prevented. Moreover, the heating time can be minimized, which makes the removal operation efficient.

Furthermore, the interior of the hood 34 (whose peripheral edge is held in intimate contact with the semiconductor-removed portion of the printed circuit board 11 to form the closed space) is kept to a negative pressure, and this avoids the situation in which the solder remains in the through holes 12, and solidifies to form foreign matters, and therefore the closing or blocking of the through holes 12 by the residual foreign matters is prevented.

Figure 7:
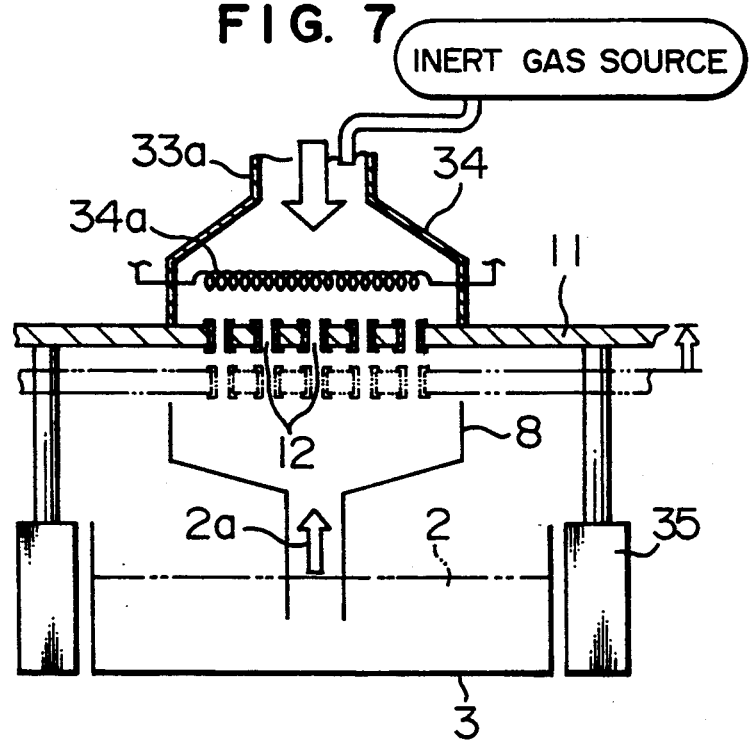
FIG. 7 is a schematic view showing a modified solder elimination means in the apparatus.

In the above embodiment, although the interior of the hood 34 (whose peripheral edge is held in intimate contact with the semiconductor-removed portion of the printed circuit board 11 to form the closed space) is kept to a negative pressure, the invention is not limited to such arrangement. For example, as shown in FIG. 7, a pressure pipe 33a may be connected to the hood 34, in which case the pressure within the closed space formed by the hood 34 is increased to thereby force residual solder 22 out of the through holes 12 toward the solder vessel 3.

Further, a heater 34a may be provided within the hood 34 the pressure within which is decreased or increased, in which case the heater 34a heats the through holes 12 from which the lead pins 16 have been removed, thereby preventing the solidification of the solder 22 in the through holes 12 more efficiently.

Figure 8:
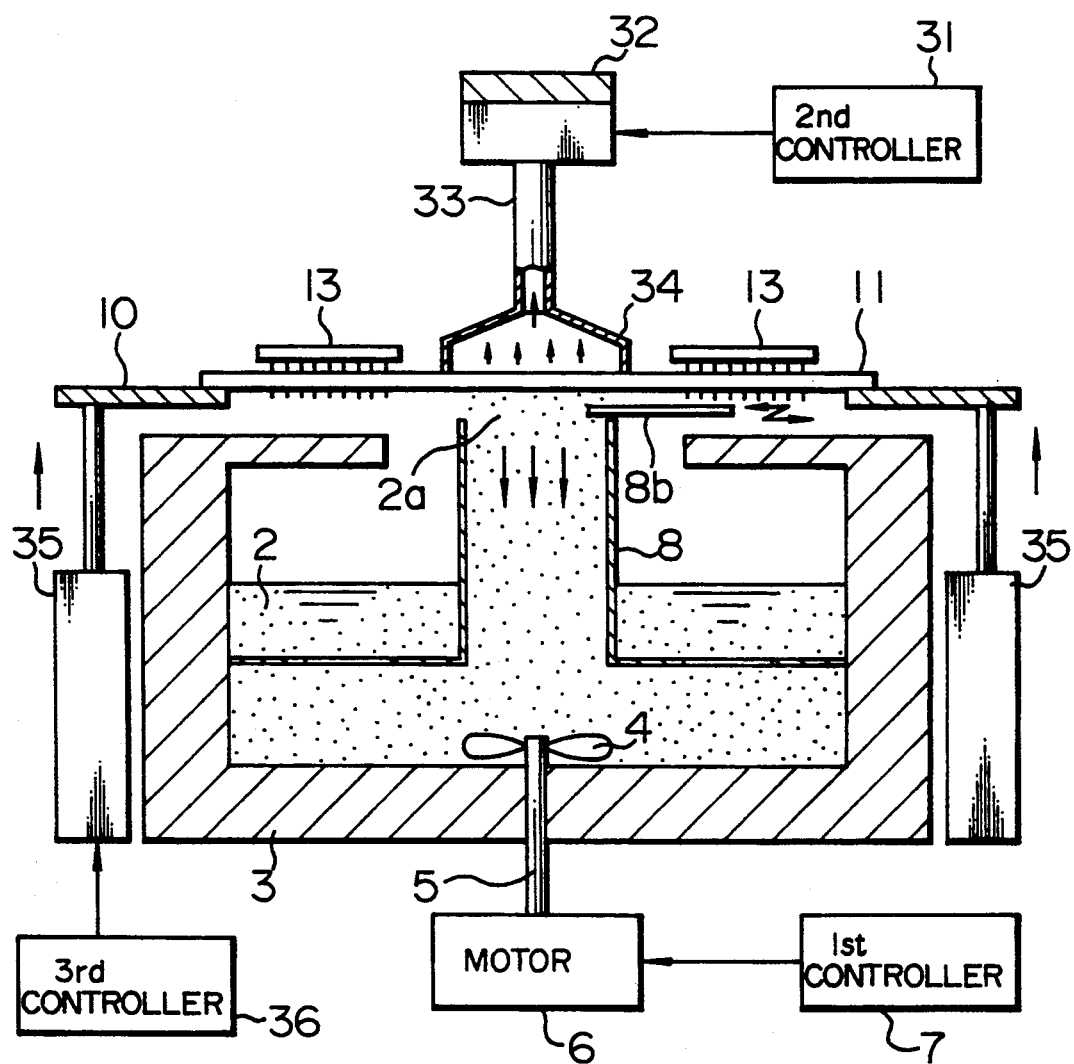
FIG. 8 is a cross-sectional view of a modified apparatus of the invention.

Further, as shown in FIG. 8, a shutter mechanism 8b for closing the ejection port of the jet nozzle 8 may be provided adjacent to the distal end of the jet nozzle 8, so that the ejection of the solder jet 2a can be forcibly stopped at a desired timing. This shutter mechanism 8b may be moved in coordinate relation to the vertical movement of the printed circuit board 11 effected by the lifters 35.

Although the present invention has been specifically described by way of the above embodiments, the present invention is not to be limited to such embodiments, and can be modified in various ways without departing the scope of the invention.

For example, in the above embodiments, although only the removal of the semiconductor device 13 from the printed circuit board 11 has been described, components or devices can be installed or mounted on the printed circuit board 11 by the use of the above apparatus.

In the above embodiments, although the heated fluid is in the form of molten solder 2 of high temperature, any other suitable liquid or gas of high temperature, such as fluorinert and nitrogen gas capable of heating the solder and the through holes to a melting point of solder, may be used.

What is claimed is:

1. Apparatus for removing an electronic device from a printed circuit board wherein lead pins of the electronic device are inserted respectively into through holes in the printed circuit board and are fixedly mounted on the printed circuit board and are fixedly mounted on the printed circuit board by being soldered, and said printed circuit board has a first main surface in facing relation to which a body of the electronic device is disposed, and a second main surface from which distal end portions of the lead pins are projected, said apparatus comprising:

board support means for supporting the printed circuit board with the first main surface thereof directed upwardly and for vertically moving the printed circuit board;

lower heating means below the board support means for applying heat to soldered portions from the second main surface side of the printed circuit board;

upper heating means above the board support means for applying heat to the soldered portions from the first main surface side of the printed circuit board;

withdrawal means disposed on the first main surface side of the printed circuit board and arranged on the apparatus above the board support means for applying a force to withdraw the electronic device from the printed circuit board, said withdrawal means detecting the withdrawal of the electronic device; and solder elimination means disposed on the apparatus above the board support means to face the first main surface side of the printed circuit board, said solder elimination means comprising a hood for covering that portion of the printed circuit board where the electronic device is mounted, and a pressure control device for increasing or decreasing a pressure within an internal space of said hood to drive the solder out of the through holes by pressurization or suction.

2. Apparatus according to claim 1, wherein said lower heating means comprises a fluid vessel holding a heated fluid, a nozzle arranged in the fluid vessel, and a propeller in the fluid vessel for ejecting said heated fluid from said fluid vessel to the second main surface of the printed circuit board via said nozzle.

3. Apparatus according to claim 1, wherein said upper heating means comprises a hot blast nozzle for applying a blast of hot gas to an upper surface of the body of the electronic device.

4. Apparatus according to claim 1, wherein said upper heating means comprises a heat block for coming into contact with an upper surface of the body of the electronic device to heat said body through heat transfer.

5. Apparatus according to claim 1, wherein said solder elimination means further comprises heater means within said hood for keeping the interior of said hood to a high temperature.

6. Apparatus according to claim 2, wherein a shield device is operatively arranged in said lower heating means for shielding the second main surface of the printed circuit board from said heated fluid.

7. Apparatus according to claim 1, wherein inert gas supply means is operatively associated with said solder elimination means for keeping the interior of said hood to an inert gas atmosphere.

8. A method of removing an electronic device from a printed circuit board wherein lead pins of the electronic device are inserted respectively into through holes in the printed circuit board and are fixedly mounted on the printed circuit board by being soldered, and said printed circuit board has a first main surface in facing relation to which a body of the electronic device is disposed and a second main surface from which distal end portions of the lead pins are projected, said method comprising the steps of:

applying heat to soldered portions from the first and second main surface sides of the printed circuit board at the same time to melt the solder, while applying a withdrawing force to the electronic device, and removing the electronic device from the printed circuit board; and subsequently driving the solder out of the through holes by pressurization and suction, thus eliminating the solder from the through holes.

9. A method according to claim 8, wherein said elimination of the solder by pressurization and suction is effected while the through holes are in a heated condition.

10. A method according to claim 8, wherein said elimination of the solder by pressurization and suction is effected in an atmosphere of inert gas.

* * * * *